(12) United States Patent
Kang et al.

(10) Patent No.: US 7,553,606 B2
(45) Date of Patent: Jun. 30, 2009

(54) METHODS OF FORMING PATTERNS IN SEMICONDUCTOR DEVICES USING PHOTO RESIST PATTERNS

(75) Inventors: Sung-Gun Kang, Gyeonggi-do (KR); Jin-Mo Kang, Gyeonggi-do (KR); Jae-Ho Lee, Gyeonggi-do (KR); Jun-Seop Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 300 days.

(21) Appl. No.: 11/542,988

(22) Filed: Oct. 4, 2006

(65) Prior Publication Data

US 2007/0196769 A1 Aug. 23, 2007

(30) Foreign Application Priority Data

Feb. 21, 2006 (KR) .................. 10-2006-0016935

(51) Int. Cl.
*G03C 5/00* (2006.01)
(52) U.S. Cl. .............. 430/296; 430/328; 430/329; 430/331; 430/942; 382/149
(58) Field of Classification Search .......... 430/296, 430/328, 329, 331, 942; 382/149
See application file for complete search history.

(56) References Cited

U.S. PATENT DOCUMENTS 5,122,387 A * 6/1992 Takenaka et al. ............ 427/493
5,942,373 A * 8/1999 Chou et al. .................. 430/296

FOREIGN PATENT DOCUMENTS

| JP | 09-292706 | 11/1997 |
| JP | 2004-095623 | 3/2004 |
| JP | 2005-302751 | 10/2005 |
| KR | 10-1999-0061118 | 7/1999 |
| KR | 10-2006-0010929 A | 2/2006 |

OTHER PUBLICATIONS

Office Action issued by Korean Intellectual Property Office on Feb. 21, 2007, corresponding to Korean Patent Application No. 10-2006-0016935.

* cited by examiner

*Primary Examiner*—Christopher G Young
(74) *Attorney, Agent, or Firm*—Myers Bigel Sibley & Sajovec, P.A.

(57) ABSTRACT

Disclosed is a method of forming patterns in semiconductor devices by using photo resist patterns. These methods comprise forming photo resist patterns on a substrate. Inferior patterns are selected among the photo resist patterns. The inferior patterns are eliminated or shrunken by irradiating the selected inferior patterns with an electron beam.

14 Claims, 9 Drawing Sheets

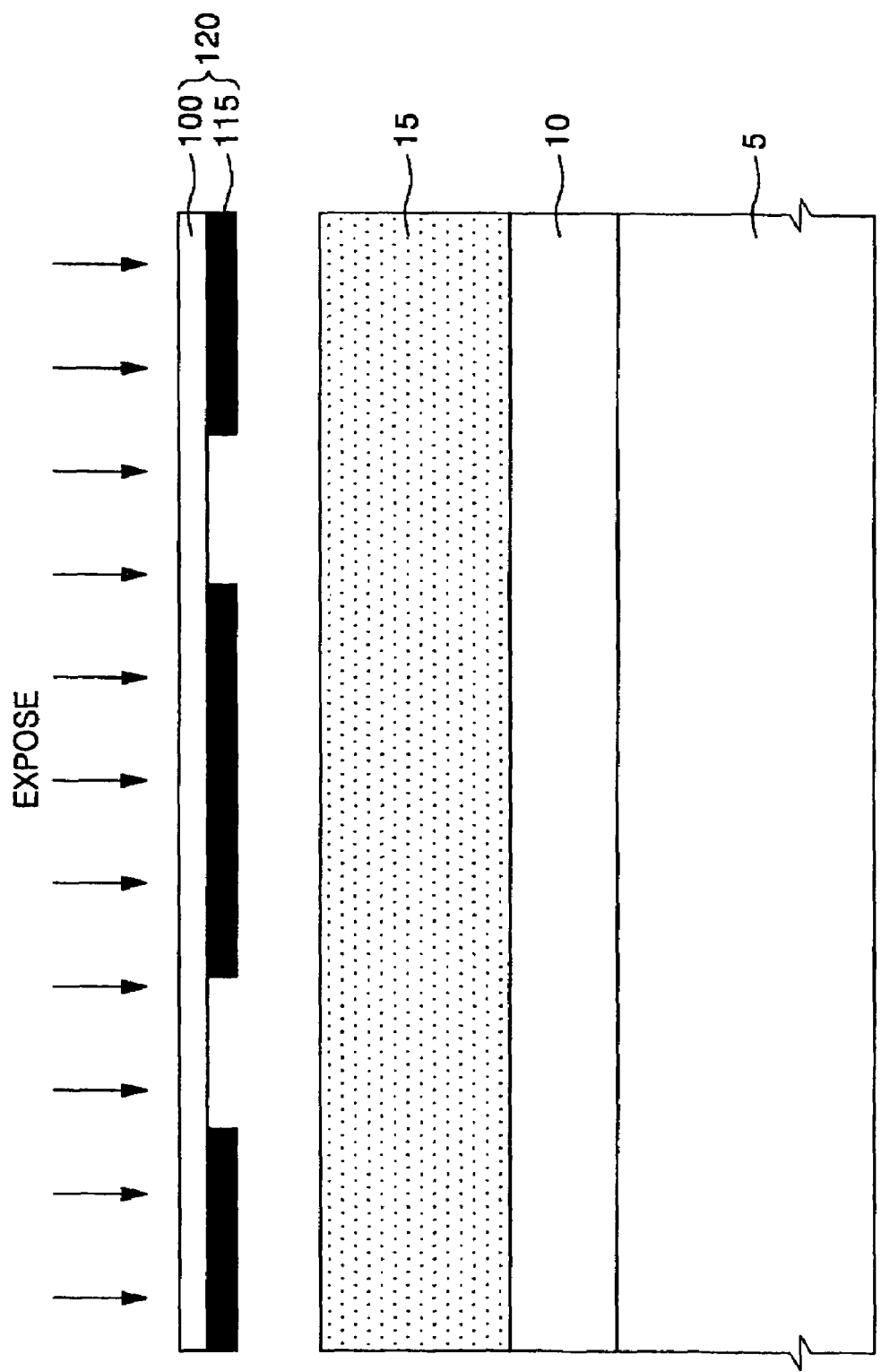

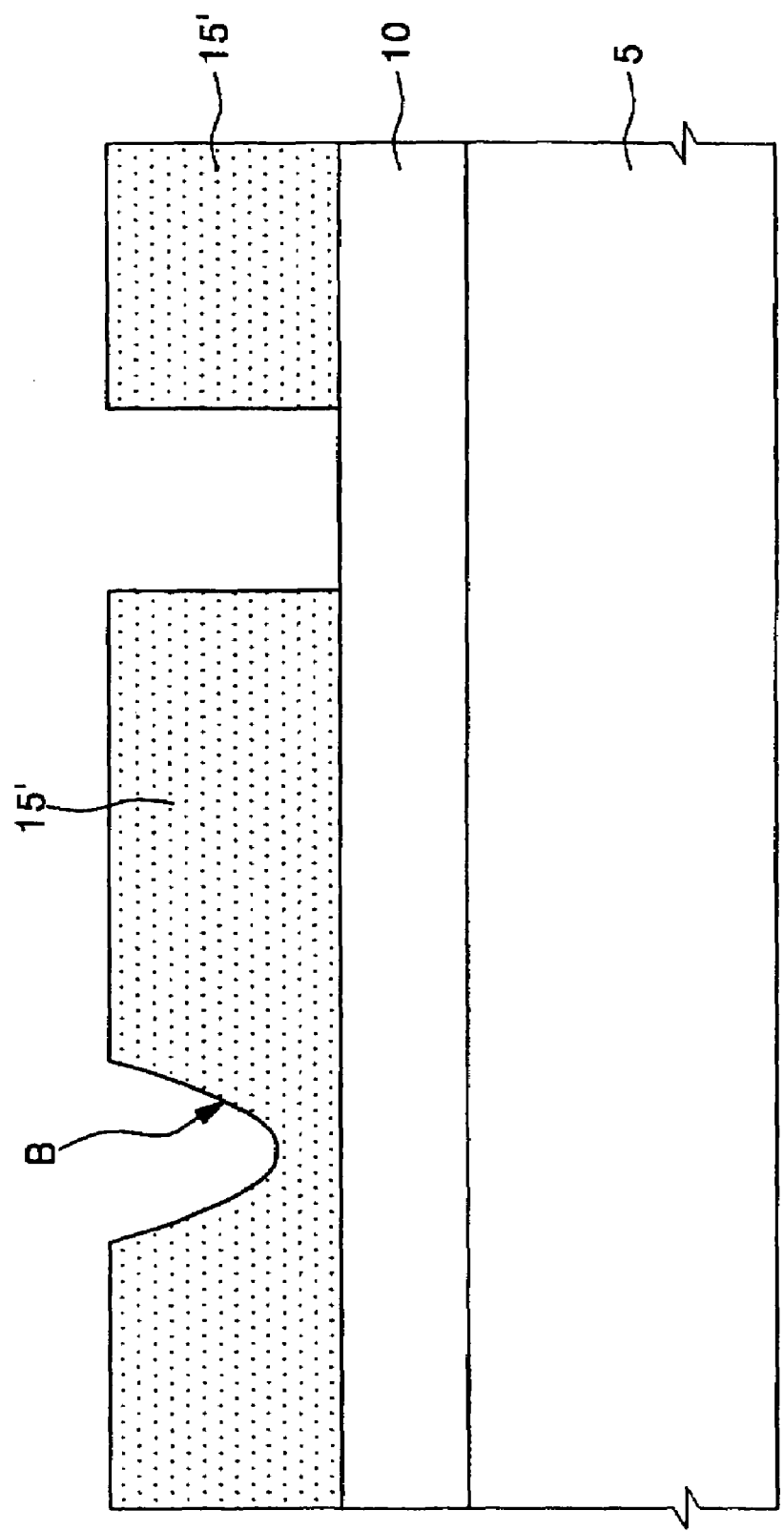

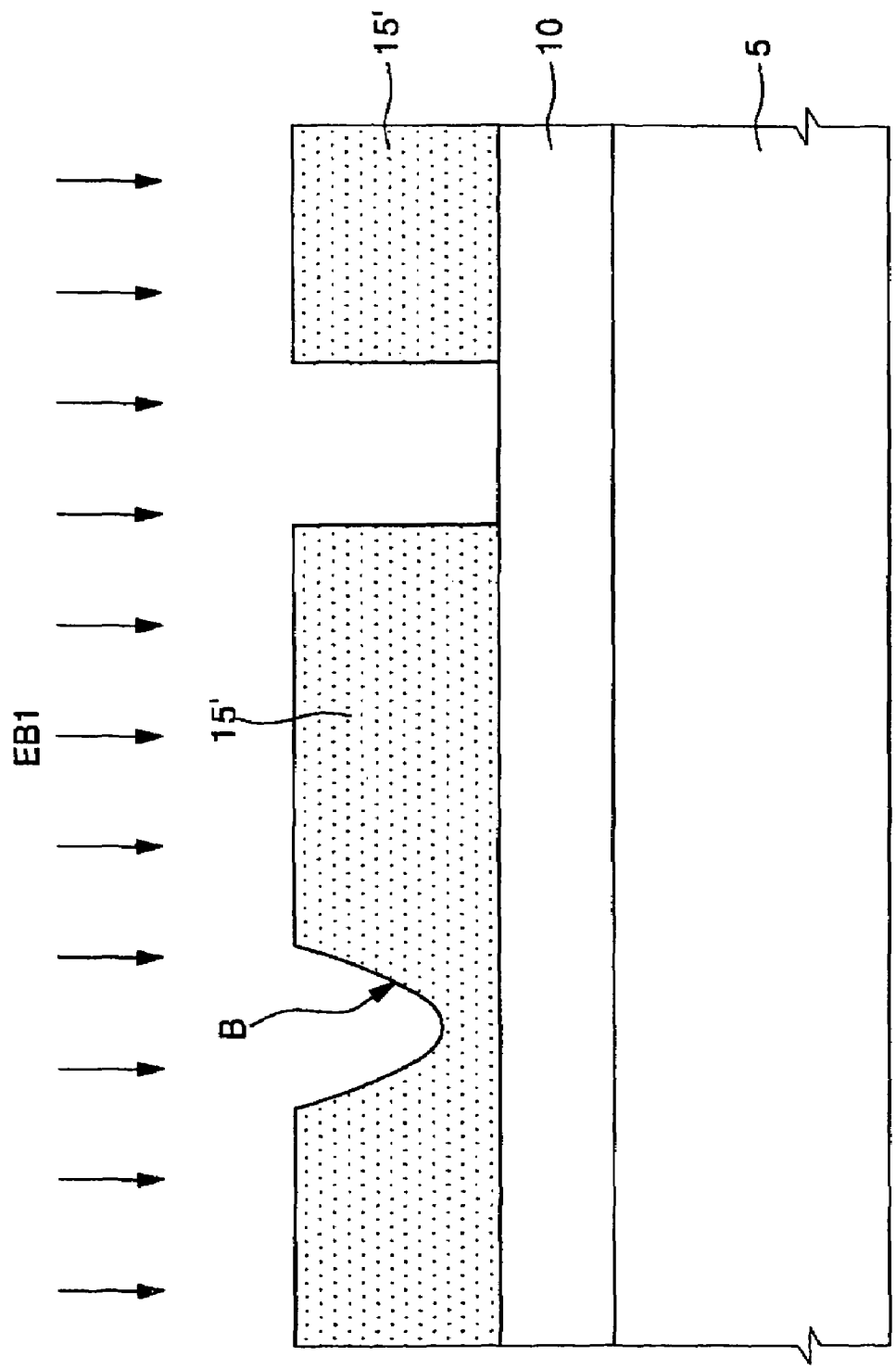

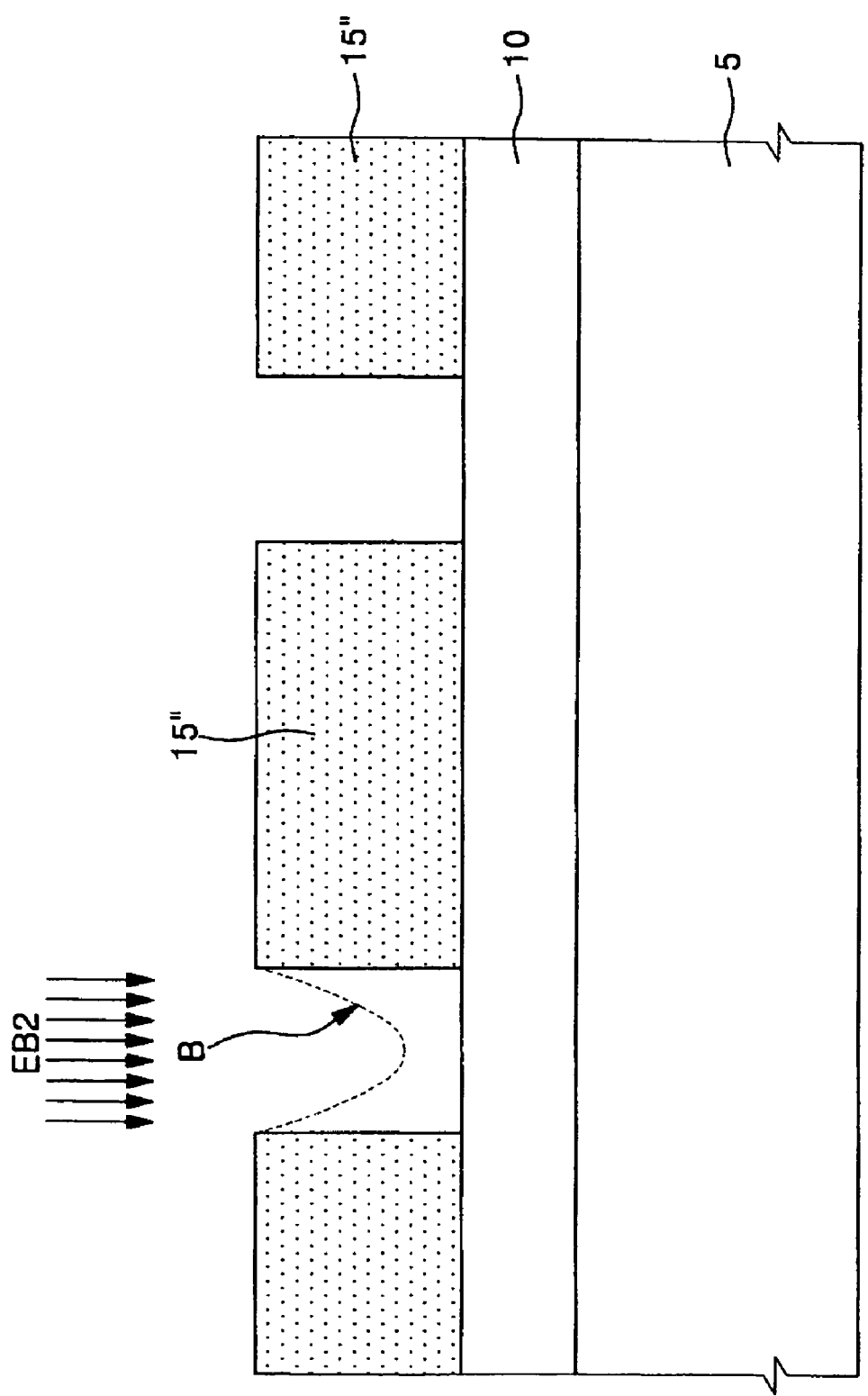

METHODS OF FORMING PATTERNS IN SEMICONDUCTOR DEVICES USING PHOTO RESIST PATTERNS

RELATED APPLICATIONS

A claim of priority is made to Korean Patent Application No. 10-2006-0016935, filed on Feb. 21, 2006, the disclosure of which is hereby incorporated by reference in its entirety.

FIELD OF THE INVENTION

The present invention relates generally to semiconductor devices and, more particularly, to methods of forming patterns in semiconductor devices.

BACKGROUND OF THE INVENTION

After forming certain layers on a semiconductor substrate, an etch mask is utilized to pattern certain layers through a photo resist trimming process. While the photo resist trimming process is performed, the thickness of a photo resist pattern may be reduced. Moreover, the etch mask may also be etched away during the process, depending on an etching selectivity ratio of the layers and the etch mask. Therefore, the etch mask may not form the layers as a target pattern.

FIG. 1 is a plan view of a semiconductor device illustrating a method of manufacturing semiconductor devices using a conventional photo resist trimming process.

Referring to FIG. 1, a layer to be etched away is formed on a semiconductor substrate P1. The layer to be etched away may be a polysilicon layer for forming a gate of a transistor, or a nitride layer for forming a hard mask. After forming the layer to be etched away, a photo resist layer is formed on the layer to be etched away. Finally, the photo resist layer is exposed and developed by using a photo mask having a designed pattern so that photo resist patterns P2 are formed. The photo resist patterns P2 may be inferior. For example, there may be a bridge pattern D1 connecting the patterns P2, or there may be a deformity pattern D2 having a wider width.

A photo resist trimming process may be performed after the semiconductor substrate P1 is loaded on etching equipment, in order to achieve minimum marginal resolution critical dimension (CD) of the photo resist patterns P2. As a result, final photo resist patterns P2' on which CD is much reduced, may be formed. The bridge inferior pattern D1 may be removed by the photo resist trimming process. The deformity pattern D2, however, may not be removed by the photo resist trimming process. Although the absolute width of the deformity inferior pattern D2 may be reduced, the relative width between the deformity pattern D2 and neighboring patterns may remain.

Moreover, the line width of the final photo resist patterns P2' is reduced by the photo resist trimming process, but the thickness of the final photo resist patterns P2' is thinner due to etching. Therefore, while the layer to be etched away is etched by using the final photo resist patterns P2', the thickness of the final photo resist patterns P2' is getting thinner as the etching process is going on. In conclusion, the final photo resist patterns P2' may not perform an etching protection layer so that the pattern shape of the layer to be etched away may be abnormal, or a portion of the layer to be etched away may be removed in worst case.

As described above, in order to overcome marginal resolution of photo equipment, and reduce the pattern width of a layer to be etched away, a photo resist trimming process is performed. As a result, it may reduce the CD of photo resist patterns and remove bridge pattern D1. However, photo resist patterns may not perform the formation of etching protection layers normally so that it may cause deterioration of pattering characteristics and difficulty in removing deformity pattern D2. Moreover, it may be impossible to use the photo resist trimming process in order to both remove the bridge pattern and maintain the CD of pattern as it was.

SUMMARY OF THE INVENTION

According to some embodiments of the invention, a method of forming patterns in semiconductor devices by using photo resist patterns is provided. This method comprises forming photo resist patterns on a substrate. Inferior patterns are selected among the photo resist patterns. The inferior patterns are eliminated or shrunken by irradiating the selected inferior patterns with an electron beam.

According to some embodiments of the invention, the method further comprises detecting the inferior patterns with a preliminary electron beam before either eliminating or shrinking the inferior patterns. The preliminary electron beam may utilize reduced energy in order to measure an image. The subsequent electron beam may utilize higher energy than the energy of the preliminary electron beam.

According to some embodiments of the invention, the inferior patterns may be burned out by the electron beam.

According to some embodiments of the invention, the inferior patterns may undergo a polymer crosslinking reaction in response to being irradiated by the electron beam.

According to some embodiments of the invention, accelerating voltages of the electron beam may be between about 1 volt and 400 kilovolts.

According to some embodiments of the invention, a layer to be etched away may be formed on the substrate before forming the photo resist patterns. The layer to be etched away may be etched by using photo resist patterns in which the inferior patterns are eliminated or shrunken, as an etch mask.

According to some embodiments of the invention, a method of forming patterns in semiconductor devices is provided. This method comprises loading a substrate having photo resist patterns on a scanning electron microscope (SEM). Inferior patterns are selected among the photo resist patterns. The inferior patterns are either eliminated or shrunken by irradiating with an electron beam.

According to some embodiments of the invention, the location of inferior patterns may be detected by irradiating the substrate with a preliminary electron beam before selecting inferior patterns among the photo resist patterns. The preliminary electron beam may utilize reduced energy in order to measure an image. The electron beam may utilize higher energy than the energy of the preliminary electron beam.

According to some embodiments of the invention, the inferior patterns may be burned out by the electron beam.

According to some embodiments of the invention, the inferior patterns may undergo a polymer crosslinking reaction in response to being irradiated by the electron beam.

According to some embodiments of the invention, accelerating voltages of the electron beam may be between about 1 volt and 400 kilovolts.

BRIEF DESCRIPTION OF THE DRAWINGS

The invention is described below in relation to several embodiments illustrated in the accompanying drawings. Throughout the drawings like reference numbers indicate like exemplary elements, components, or steps, and the thickness of layers is exaggerated for clarity. In the drawings:

FIGS. 5a through 5e are cross-sectional views taken along the cutting line I-I' of FIG. 3 and that illustrate methods of forming patterns in semiconductor devices according to embodiments of the present invention.

DESCRIPTION OF EXEMPLARY EMBODIMENTS

Figure 1:
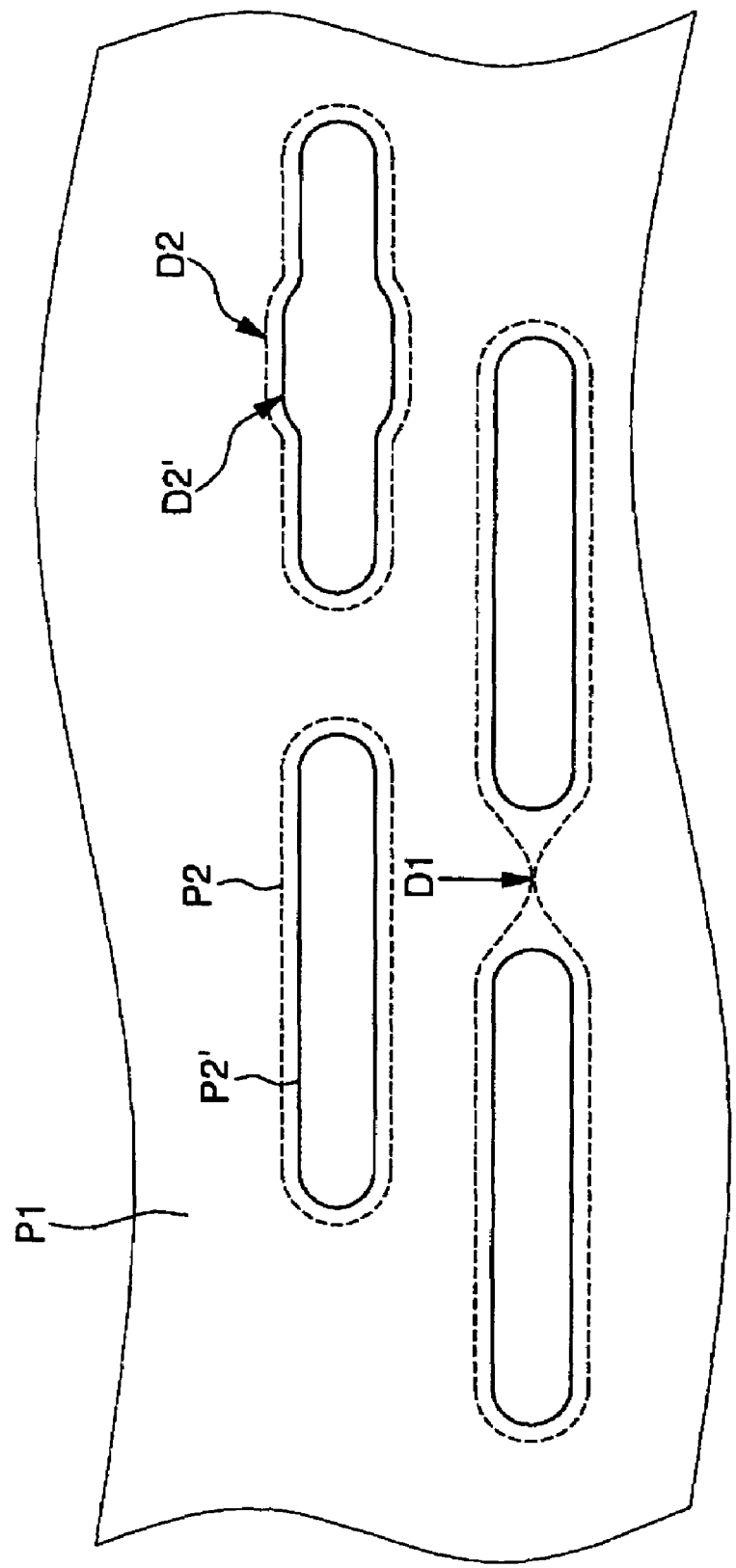
FIG. 1 is a plan view of a semiconductor device illustrating a method of manufacturing semiconductor devices using a conventional photo resist trimming process.

Exemplary embodiments of the invention are described below with reference to the corresponding drawings. These embodiments are presented as teaching examples. The actual scope of the invention is defined by the claims that follow.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to," "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to plan view illustrations that are schematic illustrations of idealized embodiments of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention unless expressly so defined herein.

It should also be noted that in some alternate implementations, the functionality of a given block may be separated into multiple blocks and/or the functionality of two or more blocks may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 2:
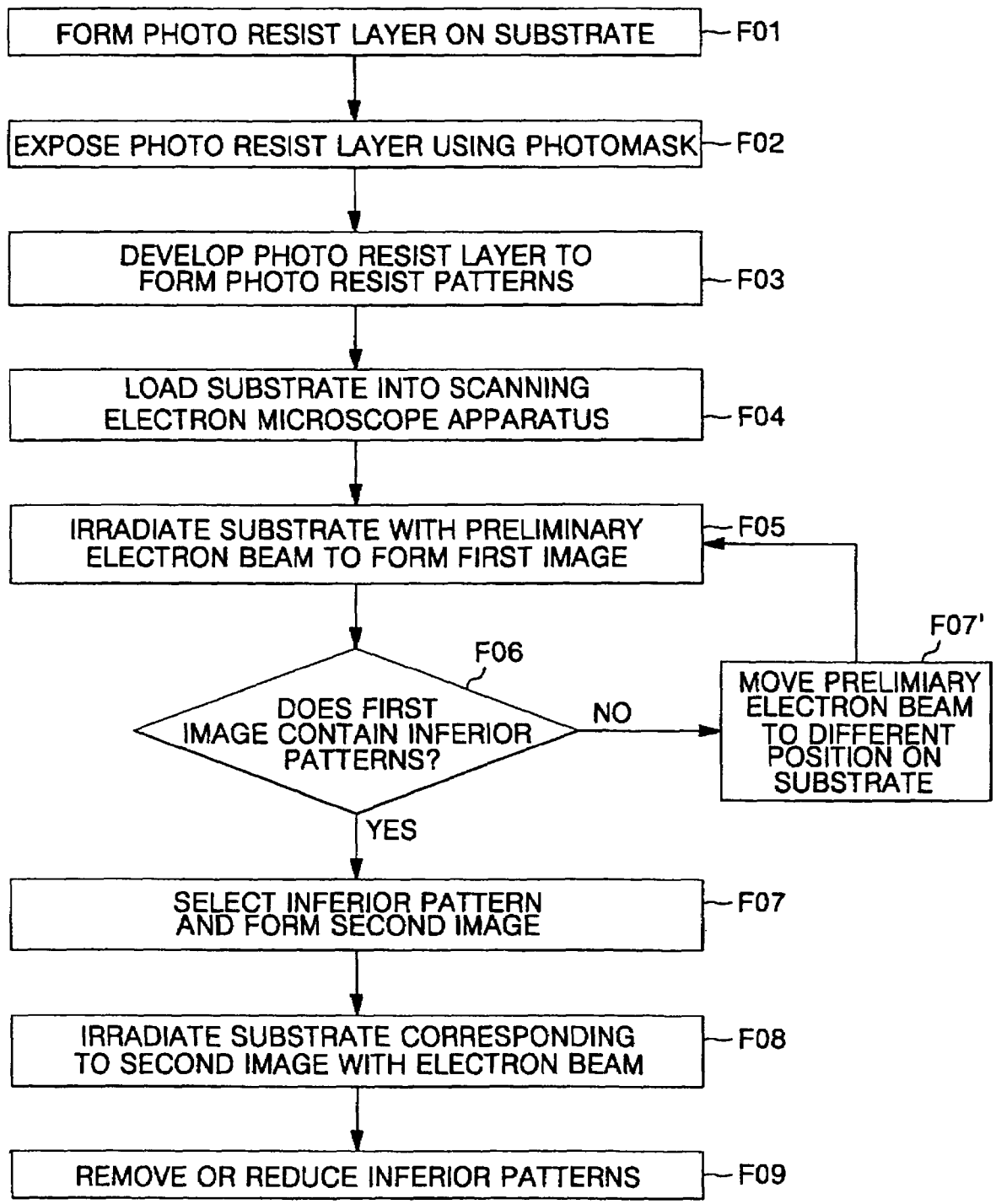
FIG. 2 is a process flow chart illustrating methods of forming patterns in semiconductor devices according to embodiments of the present invention.
Figure 3:
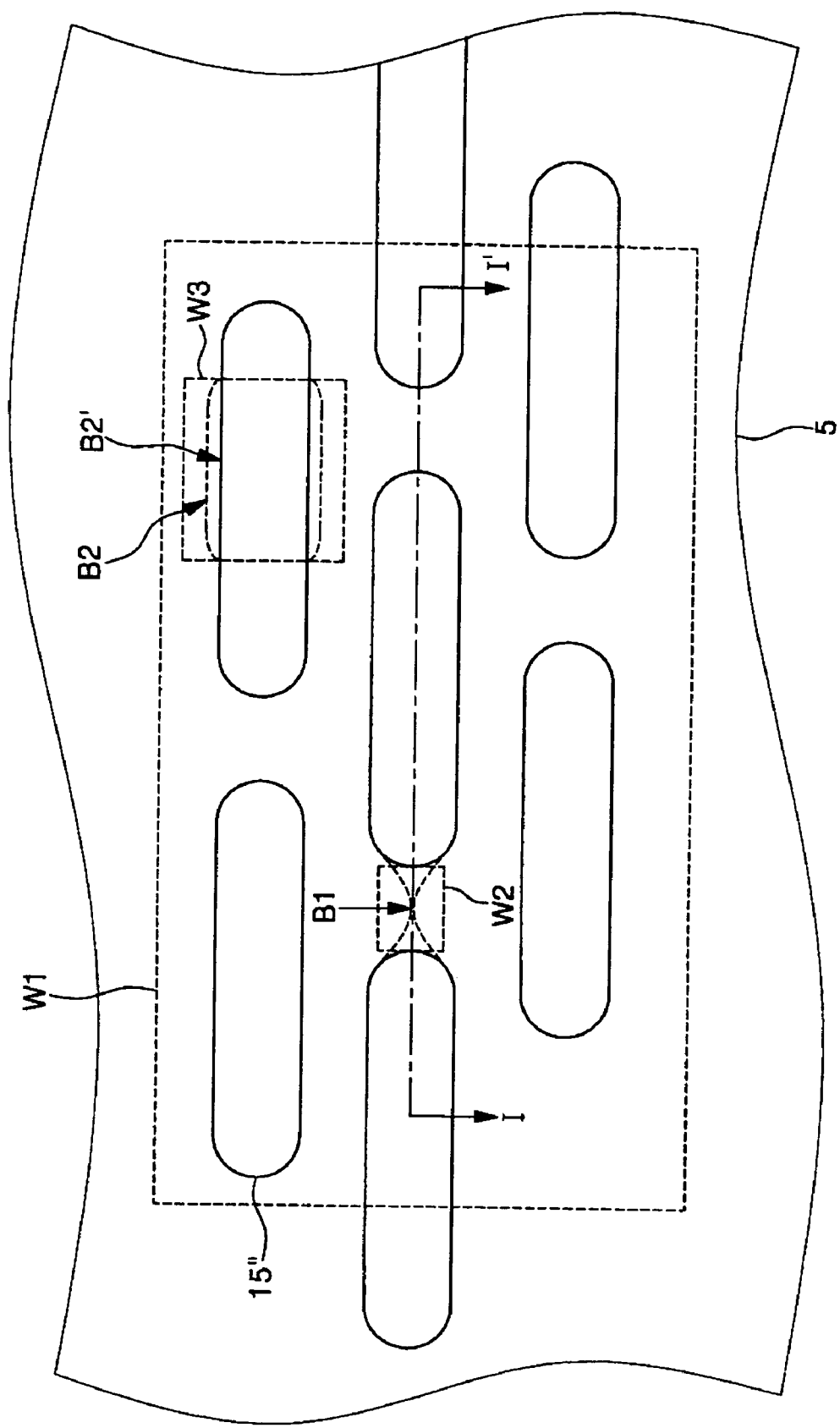
FIG. 3 is a plan view of a semiconductor device illustrating methods of forming patterns in semiconductor device according to embodiments of the present invention.
Figure 4:
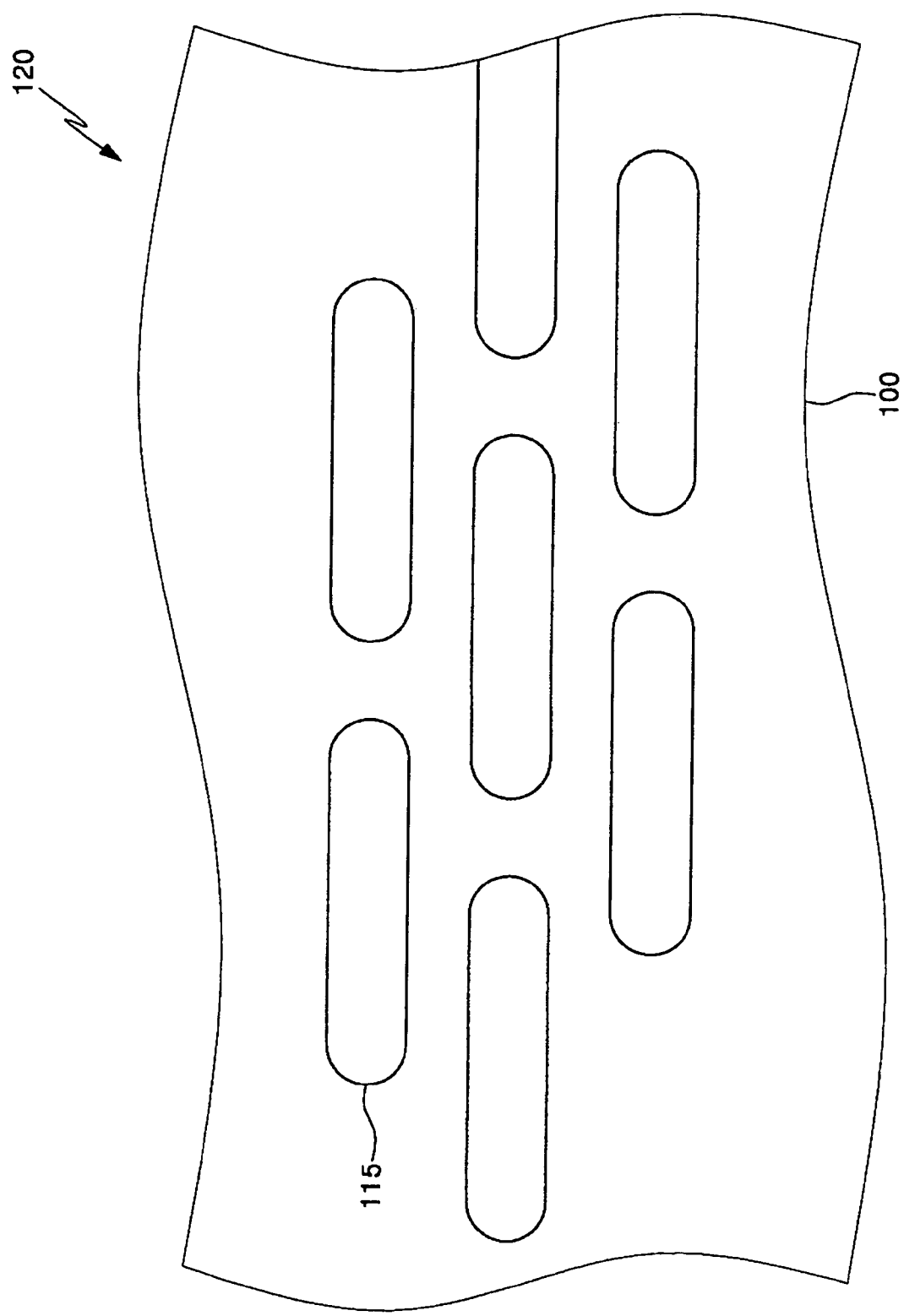
FIG. 4 is a plan view of a photo mask used for forming patterns in semiconductor devices, according to embodiments of the present invention.

Referring to FIGS. 2, 3, 4 and 5a, a layer 10 to be etched away is formed on a substrate 5. The substrate 5 may include a semiconductor substrate and/or a quartz substrate. When the substrate 5 is a semiconductor substrate, the layer 10 to be etched away may include all types of layers used in semiconductor manufacturing, such as, for example, pad nitride layers, gate layers, etc. The layer 10 to be etched away may include a shade layer like chrome, etc., when the substrate 5 is a quartz substrate. A photo resist layer 15 is formed on a substrate having the layer 10 to be etched away (Step F01 of FIG. 2). The photo resist layer 15, may be formed, for example, by using either photo resist solution for 193 nm wavelength laser light or photo resist solution for 248 nm wavelength laser light. A photo resist layer 15 is exposed by using a photo mask 120, as shown in FIG. 4 (Step F02 of FIG. 2). The photo mask 120 may include both a quartz substrate 100 and a shade pattern 115 arranged on the quartz substrate 100.

Referring to FIGS. 2, 3 and 5b, photo resist patterns 15' are formed as the photo resist layer 15 is developed (Step F03 of FIG. 2). The photo resist patterns 15' may include inferior patterns. The inferior patterns may include a bridge pattern B1, and deformity pattern B2 that is patterned in wider CD than originally designed. Both the bridge pattern B1 and the deformity pattern B2 may be caused by remains of the photo resist layer 15 that have to be removed by both exposing and developing processes. Or, in case the photo mask 120 has defects itself, the defect patterns are overall reflected to the photo resist layer 15 so that it may cause these inferior patterns.

Referring to FIGS. 2, 3 and 5c, a substrate having photo resist patterns 15' is loaded in scanning electron microscope (SEM) equipment (Step F04 of FIG. 2). A preliminary electron beam EB1 is irradiated on the substrate so that it may generate a first image W1 (Step F05 of FIG. 2). The preliminary electron beam EB1 may utilize reduced energy to measure an image. However, the photo resist patterns 15' exposed to the preliminary electron beam EB1 may be shrunken, while the first image W1 is generated by the preliminary electron beam EB1. Therefore, it is desirable to quickly process generation of the first image W1 in order not to exert an influence on CD.

A determination is made if both the bridge inferior pattern B1 and deformity pattern B2 exist within the first image W1 (Step F06 of FIG. 2). In case there are both the bridge pattern B1 and the deformity pattern B2 in the first image W1, either the bridge pattern B1 or the deformity pattern B2 is selected and a second image W2 may be generated (Step F07 of FIG. 2). The second image W2 may include the bridge pattern B1. In case there is not both the bridge pattern B1 and deformity pattern B2, the preliminary electron beam EB1 is moved to another position in the substrate so as to confirm existence of the bridge pattern B1 and the deformity pattern B2 through a new image (Step F07' of FIG. 2). Moreover, after the first image W1 is generated, the CD of the photo resist patterns 15' may be measured by using the first image W1.

Referring to FIGS. 2, 3 and 5d, the substrate is irradiated with an electron beam EB2 to generate a second image W2 (Step F08 of FIG. 2). The electron beam EB2 may irradiate with higher energy than the preliminary electron beam EB1. As a result, while the electron beam EB2 is irradiated, the bridge pattern B1 may be burned out (Step F09 of FIG. 2). Acceleration voltage of the electron beam EB2 may be between about 1 volt and 1000 kilovolts. Preferably, the acceleration voltage of the electron beam EB2 may be between about 1 volt and 400 kilovolts.

Thereafter, the electron beam EB2 is adjusted to the energy of the preliminary electron beam EB1 so that it may detect both the bridge pattern B1 and deformity pattern B2 at other areas and generate a third image W3. The third image W3 may include the deformity pattern B2 patterned to wider CD than originally designed. A miniature electron beam with energy that is higher than the preliminary electron beam EB1 and lower than the electron beam EB2, may be utilized to irradiate the substrate to generate the third image W3. The deformity inferior pattern B2, while the miniature electron beam is irradiating, may be shrunken due to a reaction of polymer cross linking. As a result, a shrunken pattern B2' having reduced CD may be formed. It adjusts the energy of the miniature electron beam so that the CD of the shrunken pattern B2' may be either equal or close to the originally designed pattern.

Each CD of the photo resist patterns 15' may be adjusted by using the miniature electron beam. In order to test the characteristics of transistors by CD of gate electrodes, for example, electron beams having different energies are irradiated to the photo resist patterns 15' so that each of CDs may be formed differently.

By repeatedly performing processing steps F05 through F09 of FIG. 2, all of the bridge inferior pattern B1 and deformity pattern B2 may be removed or reduced. Therefore, final photo resist patterns 15" may be formed.

Figure 5E:
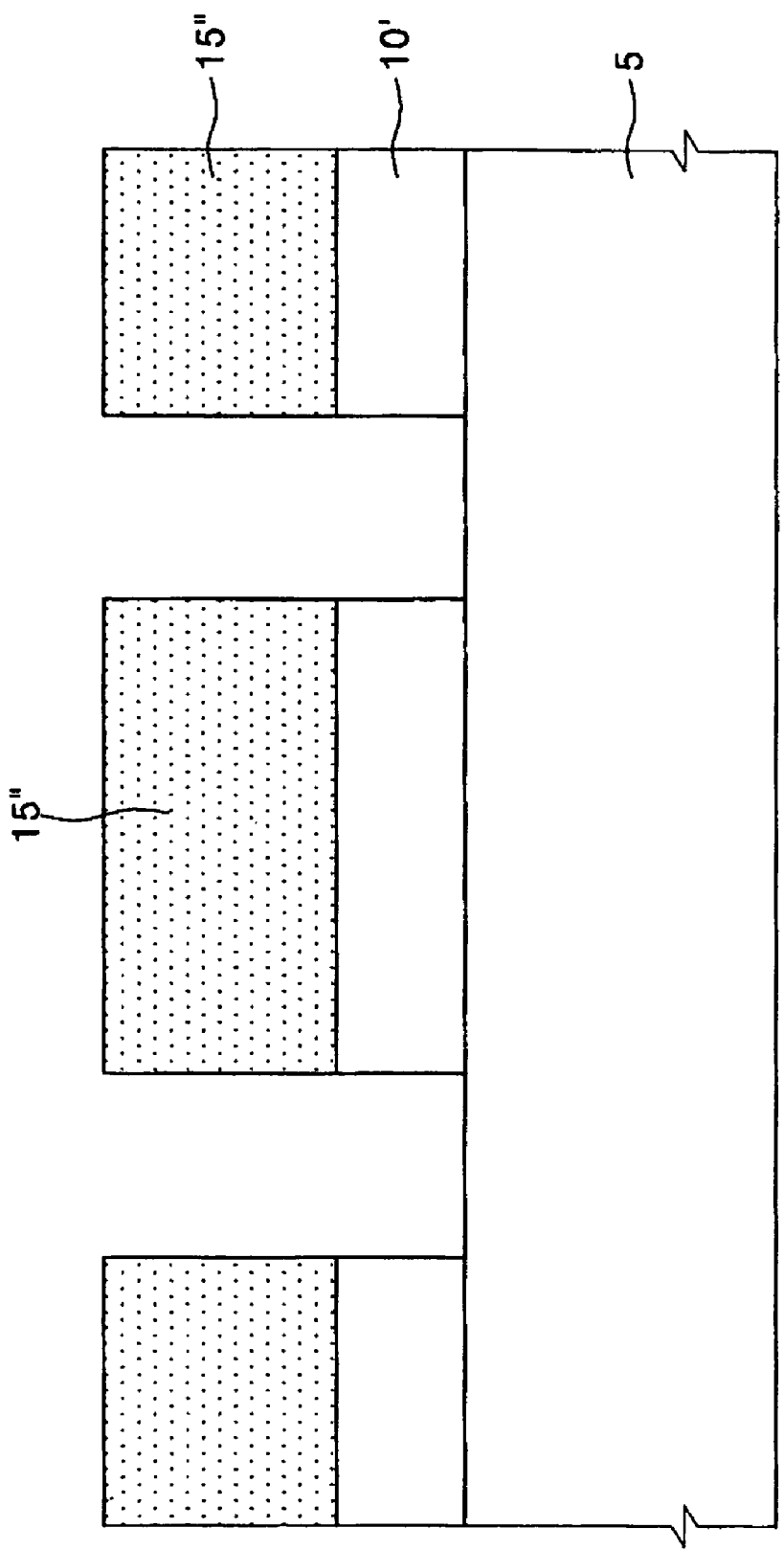

Referring to FIGS. 2, 3 and 5e, the layer 10' to be etched away is etched by using the final photo resist patterns 15" as an etch mask, so that patterns of layer 10' to be etched away may be formed. Through either removing or reducing the bridge pattern B1 and deformity pattern B2 on the photo resist patterns 15' by using an electron beam, the patterns of the layer 10' to be etched away may be either same or similar patterns as originally designed. For example, when the patterns of the layer 10' to be etched away are gate patterns and the bridge pattern B1 still remains in it, the bridge pattern B1 may be removed in advance at formation stage of the final photo resist patterns 15", so that it may increase the yield of semiconductor devices and may protect any CD reduction of unwanted patterns by either eliminating or shrinking any inferior patterns.

The foregoing exemplary embodiments are teaching examples. Those of ordinary skill in the art will understand that various changes in form and details may be made to the exemplary embodiments without departing from the scope of the present invention as defined by the following claims.

What is claimed is:

1. A method of forming patterns in semiconductor devices comprising:
   forming photo resist patterns on a substrate;
   irradiating the substrate with a preliminary electron beam to generate a first image on the substrate;
   selecting inferior patterns among the photo resist patterns within the first image;
   generating a second image on the substrate to surround the selected inferior patterns; and
   irradiating the selected inferior patterns with an electron beam having energy higher than the preliminary electron beam and corresponding to the second image to eliminate or shrink the selected inferior patterns.

2. The method of claim 1, further comprising:
   detecting the inferior patterns by irradiating the substrate with the preliminary electron beam, before selecting the inferior patterns.

3. The method of claim 1, wherein the preliminary electron beam utilizes a reduced energy capable of measuring an image.

4. The method of claim 1, wherein the inferior patterns are burned out by the electron beam.

5. The method of claim 1, wherein the inferior patterns undergo a polymer crosslinking reaction in response to being irradiated with an electron beam.

6. The method of claim 1, wherein accelerating voltages of the electron beam are between about 1 volt and 400 kilovolts.

7. The method of claim 1, further comprising:
   forming a layer to be etched away on the substrate before forming the photo resist patterns.

8. The method of claim 7, further comprising:
   etching the layer away by using photo resist patterns in which the inferior patterns are eliminated or shrunken as a etch mask.

9. A method of forming patterns in semiconductor devices, comprising:
   loading a substrate having photo resist patterns on a scanning electron microscope;
   irradiating the substrate with a preliminary electron beam to generate a first image on the substrate;
   selecting the inferior patterns among photo resist patterns within the first image;
   generating a second image on the substrate to surround the selected inferior patterns; and
   irradiating the selected inferior patterns with an electron beam having energy higher than the preliminary electron beam and corresponding to the second image to eliminate or shrink the selected inferior patterns.

10. The method of claim 9, further comprising:
   detecting the inferior patterns by irradiating the substrate with the preliminary electron beam prior to selecting the inferior patterns.

11. The method of claim 9, wherein the preliminary electron beam utilizes reduced energy in order to able to measure an image.

12. The method of claim 9, wherein the inferior patterns are burned out by the electron beam.

13. The method of claim 9, wherein the inferior patterns undergo a polymer crosslinking reaction in response to being irradiated with an electron beam.

14. The method of claim 9, wherein accelerating voltages of the electron beam are between about 1 volt and 400 kilovolts.

* * * * *